US006226188B1

(12) United States Patent
Warren

(10) Patent No.: US 6,226,188 B1
(45) Date of Patent: May 1, 2001

(54) MODULAR INTEGRATED PNEUMATIC CONNECTION DEVICE

(76) Inventor: James F. Warren, 100 SE. Pounder Rd., Corbett, OR (US) 97019

( * ) Notice: Subject to any disclaimer, the term of this patent is extended or adjusted under 35 U.S.C. 154(b) by 0 days.

(21) Appl. No.: 09/131,765

(22) Filed: Aug. 10, 1998

(51) Int. Cl.[7] .................................................. H05K 7/14
(52) U.S. Cl. ........................ 361/802; 361/752; 361/801; 29/739
(58) Field of Search .................................... 361/801, 802, 361/752; 29/741–743, 739

(56) References Cited

U.S. PATENT DOCUMENTS

| | | | |
|---|---|---|---|
| 4,223,934 | 9/1980 | Cauceglia et al. | 294/15 |
| 4,291,867 | 9/1981 | Williams et al. | 269/43 |
| 4,583,288 | 4/1986 | Young | 29/741 |
| 4,996,631 | 2/1991 | Freehauf | 361/415 |
| 5,093,984 | 3/1992 | Lape | 29/741 |
| 5,139,430 | 8/1992 | Lewis et al. | 439/157 |
| 5,162,979 | 11/1992 | Anzelone et al. | 361/415 |
| 5,238,423 | 8/1993 | Hillis et al. | 439/259 |
| 5,252,916 | 10/1993 | Swart | 324/158 P |
| 5,317,481 | 5/1994 | Hillis et al. | 361/796 |
| 5,751,559 | 5/1998 | Jensen et al. | 361/802 |
| 5,754,406 | 5/1998 | Hardt et al. | 361/756 |

FOREIGN PATENT DOCUMENTS

| | | |
|---|---|---|
| 0 064 084 | 11/1982 | (EP) . |
| 0 425 192 B1 | 3/1995 | (EP) . |
| WO 93/15409 | 8/1993 | (WO) . |

*Primary Examiner*—Jayprakash N. Gandhi
(74) *Attorney, Agent, or Firm*—William S. Lovell

(57) ABSTRACT

A modular integrated pneumatic connection device adapted for precise location onto an upper platen accepts a printed circuit board (PCB) having the edge connectors thereof facing downwardly therefrom through a slot in that upper platen. The device includes pneumatically operated and spring loaded pistons at opposite ends thereof which interact with a bracket holding the PCB, such that upon placing that upper platen above a lower platen having disposed thereon a test board or the like including printed circuit board connectors that are in alignment with those PCBS, application of pneumatic pressure forces the edge connectors of those PCBs in the upper platen into the PCB connectors disposed on the test board or the like on the lower platen, thereby making electrical contact for testing and similar purposes, i.e., as a "Unit Under Test" (UUT). Upon release of the pneumatic pressure, the PCB is withdrawn from that connection by operation of the above-mentioned springs. Since the pneumatically operated pistons are integrated within the device module, that module can be made in a sufficiently narrow dimension (e.g., 0.790 in.) to permit use of an array of the same in connection with the standard inter-connector layout dimension (e.g., 0.800 in.) of PCB connectors or the like on test boards, motherboards and the like. Upon appropriate changes in dimensions, the device is also applicable for the testing of central processing units (CPUs) or other electronic components, or alternatively for the application of arrays of one or more test probes onto a mother board or the like (which would then become the "UUT"), and with respect to PCBs, CPUs or any other type of UUT, the module presents the advantage that each such UUT may be individually connected and disconnected.

8 Claims, 6 Drawing Sheets

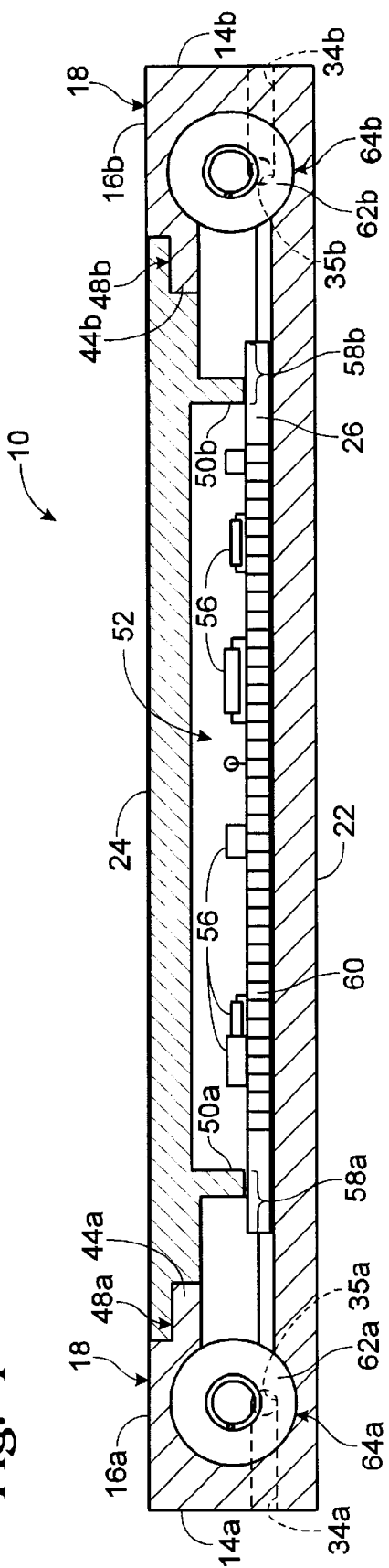
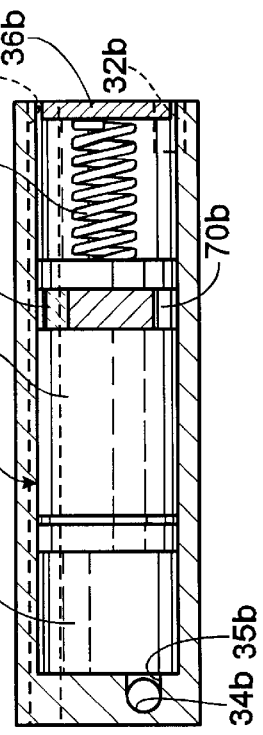
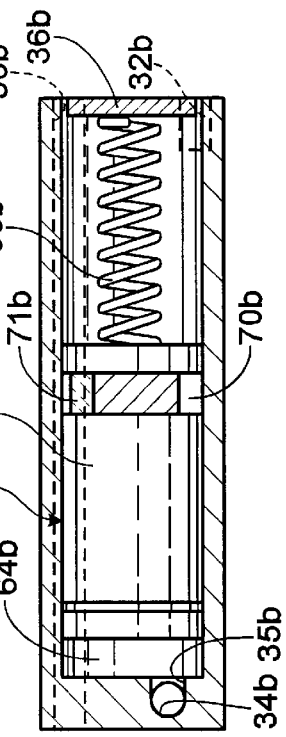
Fig. 4
Fig. 7
Fig. 8

MODULAR INTEGRATED PNEUMATIC CONNECTION DEVICE

BACKGROUND OF THE INVENTION

1. Field of the Invention

This invention relates to printed circuit boards (PCBS) and other electronic components such as CPUs and test probes, such devices from appropriate slots or connectors in a larger circuit device, including motherboards, and especially into such larger circuit devices that are adapted for testing the circuit performance either of such electronic components or of the larger circuit device.

2. Background Information

A number of different methods and apparatus have been devised for purposes of installing printed circuit boards (PCBs) into appropriate slots contained within the mother board of a computer, including the device described in U.S. Pat. No. 5,751,559 issued May 12, 1998 to Jensen et al. wherein the connecting direction of the PCB is perpendicular to its insertion direction. Other devices address both insertion and removal of a PCB, including the circuit board insertion and extraction tool of Hillis et al. described in U.S. Pat. No. 5,238,423 and 5,317,481, respectively issued on Aug. 24, 1993 and May 31, 1994; the lever-acting circuit board injector/ejector system described in U.S. Pat. No. 4,996,631 issued Feb. 26, 1991 to Freehauf; a similar device described in U.S. Pat. No. 5,139,430 issued Aug. 18, 1992 to Lewis et al.; another lever-acting device described in U.S. Pat. No. 5,162,979 issued Nov. 10, 1992 to Anzelone et al., which was also filed as European Appl. No. 90311407.2 on Oct. 17, 1990 and published as Publication No. 0 425 192 B1; and yet another lever-acting device described in U.S. Pat. No. 4,223,934 issued Sep. 23, 1980 to Cauceglia et al. Another device addresses inserting and removing PCBs into and from a motherboard without risking shorting out to adjacent, powered PCBS, described in U.S. Pat. No. 5,754,406 issued May 19, 1998 to Hardt et al.

Other technology is used in the context of installing integrated circuit (IC) devices (e.g., dual-in-line packages or "DIPs," surface mounted devices or "SMDs" and the like) into "burn-in" boards in which the devices are to be operated prior to distribution and sale, as in the vacuum operated, automated loader/unloader described in U.S. Pat. No. 5,093,984 issued Mar. 10, 1992 to Lape. In this device, a PCB carrier holding a burn-in board is translationally moved along a first horizontal axis and a "pick-and-place" unit to which are fed the ICs to be installed is translationally moved along a second horizontal axis perpendicular to that first horizontal axis, the positions of the ICs and corresponding sockets in the burn-in board being adjusted under computer control to permit installation and removal of the ICs.

In U.S. Pat. No. 4,583,288 issued Apr. 22, 1986 to Young, an apparatus is described that employs gripper means to grasp individual DIPs or the like and insert them into a PCB under pneumatic control. Another patent that relates to the installation of ICs and similar circuit components into PCBs is found in the automatic insertion universal work holding system describe in U.S. Pat. No. 4,291,867 issued Sep. 29, 1981 to Williams et al., which was also filed as European Appl. No. 81103252.3 on Apr. 30, 1981 and published as Publication No. 0 064 084 A1. In the prior art described within this patent, an insertion head is mounted above a work board holder on an X-Y table, onto which are mounted an array of PCBs into which components are to be inserted, each of such PCBs being fixedly positioned above a "window" aperture in the work board holder so as to permit access thereto from the underside thereof, it being asserted that the types of PCBs that can so be treated will be limited by their need to be matched against corresponding window apertures. The Williams et al. device mounts individual PCBs within individually controlled U-frame members for the purpose of accommodating PCBs of arbitrary size, dimension and orientation, and then from above a particular set of such PCBs so mounted, appropriate component feeding tracts and insertion devices are used to insert particular IC components into those PCBs.

A fluid-actuated and pneumatically-operated device for testing PCBs is described in U.S. Pat. No. 5,252,916 issued Oct. 12, 1993 to Swart, which was also filed as PCT Appl. No. WO 93/15409 on Jan. 14, 1993. Intended to supplant previous "bed of nails" devices in which a PCB is pressed downward onto an array of custom-activated and spring-loaded test probes, the Swart device employs a pneumatically operated flexible diaphragm to place an array of solid test probes into contact with corresponding test points on the PCB.

From the foregoing, it can be seen that while the art of pneumatic control and other methods of automatic manufacture have been applied to the task of inserting IC components or the like into PCBs, the task of inserting PCBs or similarly CPUs into underlying motherboards or the like has not received as much attention. Whether for "burn-in" purposes as treated in the device of Lape noted above as to IC components or for general testing purposes, it is also necessary that PCBs be installed temporarily into a larger circuit board. The prior art in this more specific area is found dominantly in box-like structures containing a lower platen into which a parent board is disposed horizontally above a "bed of nails" array of test probes or the like so as to be provided with necessary voltage and signals from the underside thereof, and then a fixture containing an assemblage of pre-positioned PCBs extending transversely downwardly (the edge connectors thereof facing downward) therefrom is placed within an upper platen, insertion of the edge connectors of those PCBs into the appropriate connectors or slots within the parent board then being accomplished by downward movement of the upper platen. A disadvantage of this system, however, is that no individual control of particular PCBs or other components is provided, and the substantial insertion force required to insert all of such PCBs and other components at one time, e.g., in the range of 300 lbs. of pressure, can frequently damage or break either a PCB or an underlying connector in the event of any misalignment. Because of the close spacing between "card slots" such as PCI and ISA connectors within the typical computer, and in other similar contexts, it has been proven quite difficult to devise any kind of system that would permit individual handling of PCBs in such "close quarters." It is thus the principal purpose of the present invention to provide a method and apparatus for removably installing printed circuit boards having edge connectors into corresponding receiving connectors mounted in larger circuit boards, in a way that has optimum convenience and is least likely to cause damage or breakage to the PCBs or other circuit boards so being treated, the method and apparatus so provided then being applicable as well to the handling of CPUs or other such devices.

SUMMARY OF THE INVENTION

The invention comprises a modular integrated pneumatic connection device (MIPCD) wherein, in each instance of such device, in the exemplary discussion presented a selected printed circuit board (PCB) is held within a device body with the edge connectors of the PCB pointing downwardly, and pneumatic pressure is then applied to that device body under computer control so as to cause downward movement of the PCB against an opposing spring force so that the edge connectors thereof engage an underlying connector on a larger circuit board. Upon removal of the pneumatic force, the PCB is then withdrawn from the underlying connector by the indicated spring means. An array of MIPCDs loaded with appropriate PCBs is placed within a mounting frame in pre-selected dispositions, either all lying on parallel axes or with some disposed at some angles to others, the mounting frame then being placed within an upper platen disposed above a lower platen containing the larger circuit board, the upper platen not thereafter being moved downwardly, but only individual MIPCDs are activated in a predetermined fashion so as to cause selective downward movement of individual PCBs. The same method and apparatus, with appropriate changes in dimensions, can be applied to the testing of CPUs or other such "Units Under Test" ("UUT"), or alternatively, the MIPCD may be used for the selective connection or disconnection of an array of one or more test probes, in which case the circuitry to which such test probes are applied then becomes the UUT.

BRIEF DESCRIPTION OF THE DRAWINGS

The preferred embodiments of the invention will be described with reference to the accompanying drawings, wherein corresponding components are uniformly numbered in each of the drawings and in which:

FIG. 4 is a longitudinal cross-sectional view of a preferred embodiment of the invention taken along the lines 4—4' of FIG. 1 that shows additional detail concerning the structure of the cover plate over a printed circuit board.

FIG. 7 is a transverse cross-sectional view of the pneumatic driver of FIG. 5, taken along the lines 7—7' of FIG. 5.

FIG. 8 is a transverse cross-sectional view of the pneumatic driver of FIG. 6, taken along the lines 8—8' of FIG. 6.

DETAILED DESCRIPTION OF THE INVENTION

Figure 1:
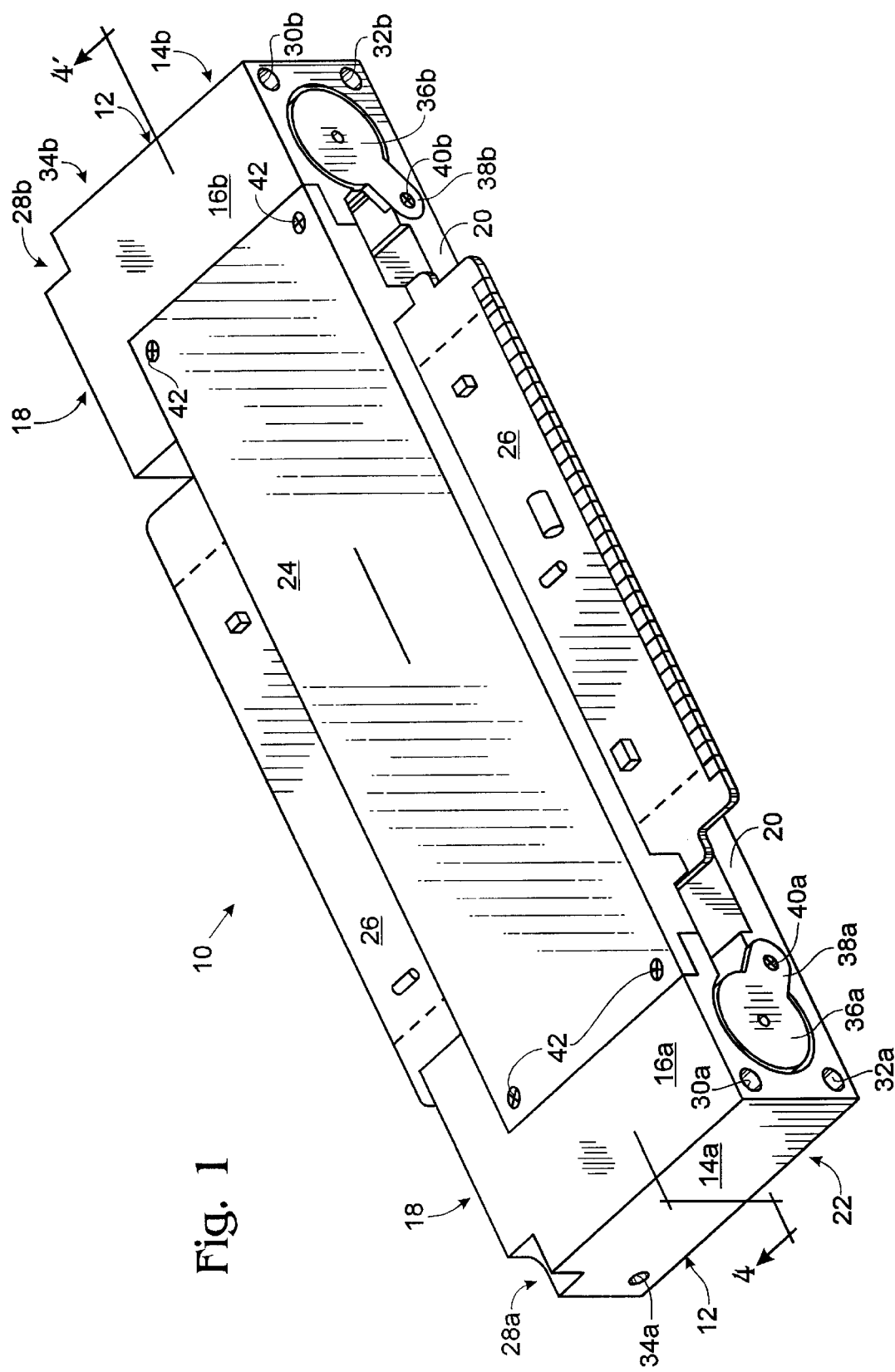
FIG. 1 is a perspective view of a preferred embodiment of the modular integrated pneumatic connection device (MIPCD) looking towards the front, bottom and a first end surfaces, and including a printed circuit board.

FIG. 1 shows a preferred embodiment of the invention from an oblique perspective view looking at the front and bottom surfaces of the device, which is designated as modular integrated pneumatic connection device (MIPCD) 10 and has the general shape of an elongate rectangular box. More specifically, MIPCD 10 comprises box-like body 12 having first and second ends 14a, 14b, a first end piece 16a, a second end piece 16b, a top surface 18, a bottom surface 20 and a fully rectangular back surface 22, this latter surface not being shown in FIG. 1. First and second end pieces 16a, 16b have removably disposed therebetween a cover plate 24 that has a rectangular outward facing surface that, when cover plate 24 is installed, preferably lies flush and coplanar with outward facing surfaces of first and second end pieces 16a, 16b. As will be shown in greater detail in later drawings, MIPCD 10 serves to accommodate a printed circuit board (PCB) 26 that is disposed within the interior of body 12 on an inward side of cover plate 24.

Also visible in FIG. 1 are half-round first and second corner notches 28a, 28b respectively disposed (in FIG. 1) at the upper left corner of first end piece 16a and the upper right corner of second end piece 16b. First and second mounting holes 30a and 30b lie along axes that extend downwardly through body 12 from respective centers of notches 28a, 28b, terminal ends of mounting holes 30a, 30b being respectively visible in FIG. 1 near the left and right front corners of bottom surface 20. Also shown in FIG. 1 are first and second alignment holes 32a and 32b, respectively disposed (in FIG. 1) near the left and right rear corners of bottom surface 20, and which more specifically are circular holes bored inwardly to a distance of approximately one-half inch and serve to accept alignment pins extending outwardly from a frame (not shown in FIG. 1) onto which MIPCD 10 is to be installed. That is to say, MIPCD 10 is installed for use by placing the same onto that frame such that the alignment pins just mentioned pass into alignment holes 32a, 32b, and then elongate screws (not shown) are placed screw-end first into notches 28a, 28b and passed through mounting holes 30a and 30b to protrude from bottom surface 20 of MIPCD 10 and become screwed into correspondingly positioned screw holes (not shown) within the frame to which MIPCD 10 is to be attached.

As will be more fully described below, MIPCD 10 operates in part by way of an applied pneumatic pressure, and in FIG. 1 near the top rear corner of first end surface 14a is seen a first pneumatic inlet 34a, a corresponding second pneumatic inlet 34b being disposed in a facing relationship within second end surface 14b but not being visible in FIG. 1, and also corresponding short pneumatic channels 35a and 35b connecting those pneumatic inlets to internal cylinders likewise not visible in FIG. 1.

Quasi-circular first and second spring retainers 36a, 36b are seen in FIG. 1 to be coplanarly disposed within bottom surface 20 near opposite ends thereof, each of spring retainers 36a, 36b further comprising respective protrusions 38a, 38b that also lie coplanar within bottom surface 20. Passing normally through protrusions 38a, 38b into bottom surface 20 are respective retainer mounting screws 40a, 40b that serve to attach spring retainers 36a, 36b to bottom surface 20. As will be discussed further below, MIPCD 10 includes among its components a pair of springs (not shown in FIG. 1) disposed therewithin, and spring retainers 36a, 36b are attached to bottom surface 20 after such springs have been installed and serve to retain those springs in the locations at which they are so installed. Cover plate 24 is also seen in FIG. 1 to be held in place by cover plate screws 42 disposed near the four corners of cover plate 24. (For purposes of clarity in FIG. 1, additional relevant details concerning the structure of PCB 26 are omitted and will be shown in later drawings.)

Figure 2:
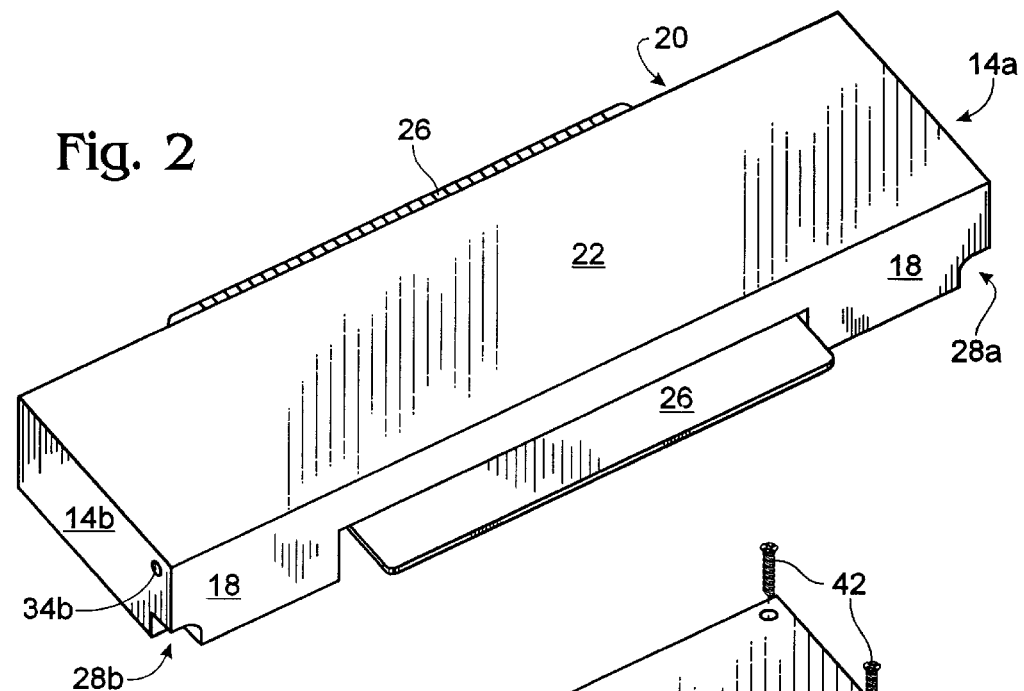
FIG. 2 is another perspective view of the device of FIG. 1, but in this case looking towards the top, rear, and a second end surfaces.

FIG. 2 is another perspective view of the principal embodiment of the invention of FIG. 1 but looking towards the top and rear surfaces thereof, and also towards second end 14b thereof opposite first end 14a shown in FIG. 1. FIG. 2 thus shows top surface 18, rectangular back surface 22, second end surface 14b and second pneumatic inlet 34b that were not directly visible in FIG. 1.

Figure 3:
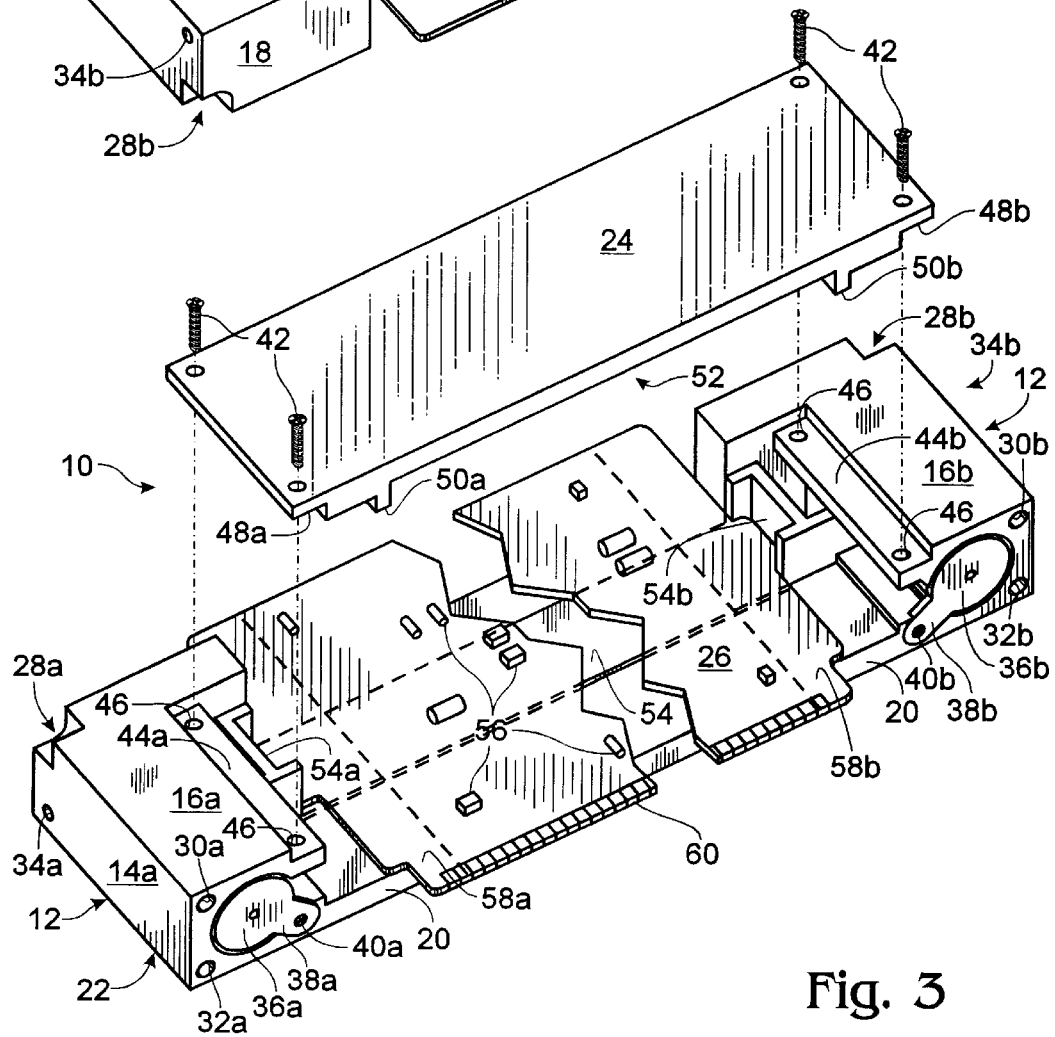
FIG. 3 is an exploded perspective view of the device of FIG. 1 looking towards the front, bottom and a first end surfaces but wherein the cover plate has been removed.

FIG. 3 is a perspective view of MIPCD 10 of FIG. 1 but in exploded form wherein cover plate 24 has been removed outwardly. In addition to the elements already shown and numerically identified, FIG. 3 further shows first and second cover plate shelves 44a, 44b, which are mutually and inwardly facing extensions of body 12 that extend beyond corresponding first and second end pieces 16a, 16b, shelves 44a, 44b further having a lateral width essentially equal to that of cover plate 24, and both shelves 44a, 44b contain screw holes 46 that are sized to receive cover plate screws 42. Cover plate 24 can also be seen to have first and second notches 48a, 48b extending fully laterally at each of the inward ends thereof so that cover plate 24 can be placed onto shelves 44a, 44b while leaving the outer surface of cover plate 24 flush with first and second end pieces 16a, 16b. In addition, displaced a predetermined distance inwardly from notches 48a, 48b are respective mutually parallel first and second friction walls 50a, 50b, which in turn are separated by an indentation 52. Friction walls 50a, 50b are placed in immediate contact near to opposite ends of an inserted PCB 26, and as will be discussed below, in the operation of MIPCD 10, PCB 26 is made to slide past friction walls 50a, 50b which are in contact therewith. Also shown in cutaway in FIG. 3 are PCB bracket 54 having first and second PCB retainers 54a, 54b at opposite ends thereof, the detailed function of which will be discussed below.

With regard to the relevant structure of PCB 26, FIG. 3 further shows an array of arbitrarily selected electronic components 56 as will exemplify the structure of a PCB, and it is to accommodate the presence of such components on typical PCBs that indentation 52 of cover plate 24 is provided. At each end of PCB 26 there are shown mutually parallel first and second holding strips 58a, 58b that makes contact with friction walls 50a, 50b in the operation of MIPCD 10. Also now shown in FIG. 3 on the frontward edge of PCB 26 is an array of edge connectors 60, designating the edge on which shown as the edge of PCB 26 that is to be placed into electronically connecting contact within a corresponding connection of a mother board or the like upon the use of MIPCD 10.

FIG. 4 is a longitudinal cross-sectional view of MIPCD 10 of FIG. 1 taken along the lines 4—4' of FIG. 1 that better shows some additional detail concerning the structure of cover plate 24. Thus, the manner in which cover plate 24 rests on shelves 44a, 44b by virtue of first and second notches 48a, 48b that are respectively disposed at mutually facing ends of first and second end pieces 16a, 16b is more easily seen. The manner in which first and second friction walls 50a, 50b lie in contact respectively with holding strips 58a, 58b can also be better seen. The locations of first and second pneumatic inlets 34a, 34b are shown in outline, particularly showing that they respectively come into contact with first and second pneumatic drivers 62a, 62b, or more specifically with first and second pneumatic channels 35a, 35b that extend respectively from first and second pneumatic inlets 34a, 34b to corresponding first and second pneumatic cylinders 64a, 64b that are transversely disposed near opposite ends of MIPCD 10, those first and second pneumatic cylinders 64a, 64b extending inwardly from bottom surface 20 to a point just short of top surface 18, a more detailed structure of pneumatic drivers 62a, 62b being shown in FIGS. 5–8. Electronic components 56 that are distributed on the inward facing surface of PCB 26 are seen in FIG. 4 in a side view, and edge connectors 60 are seen in an end view.

Figure 5:
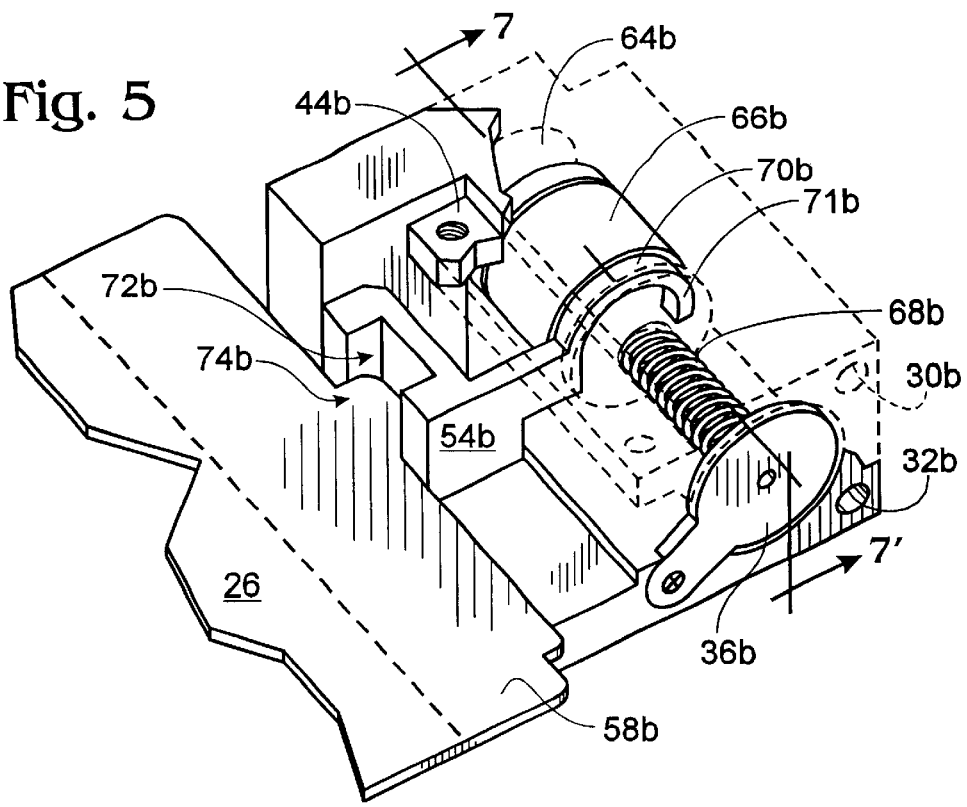
FIG. 5 is a partially transparent and partially cutaway view of one of the pneumatic drivers through which the device of FIG. 1 operates, in which an included piston is shown in an inward disposition.
Figure 6:
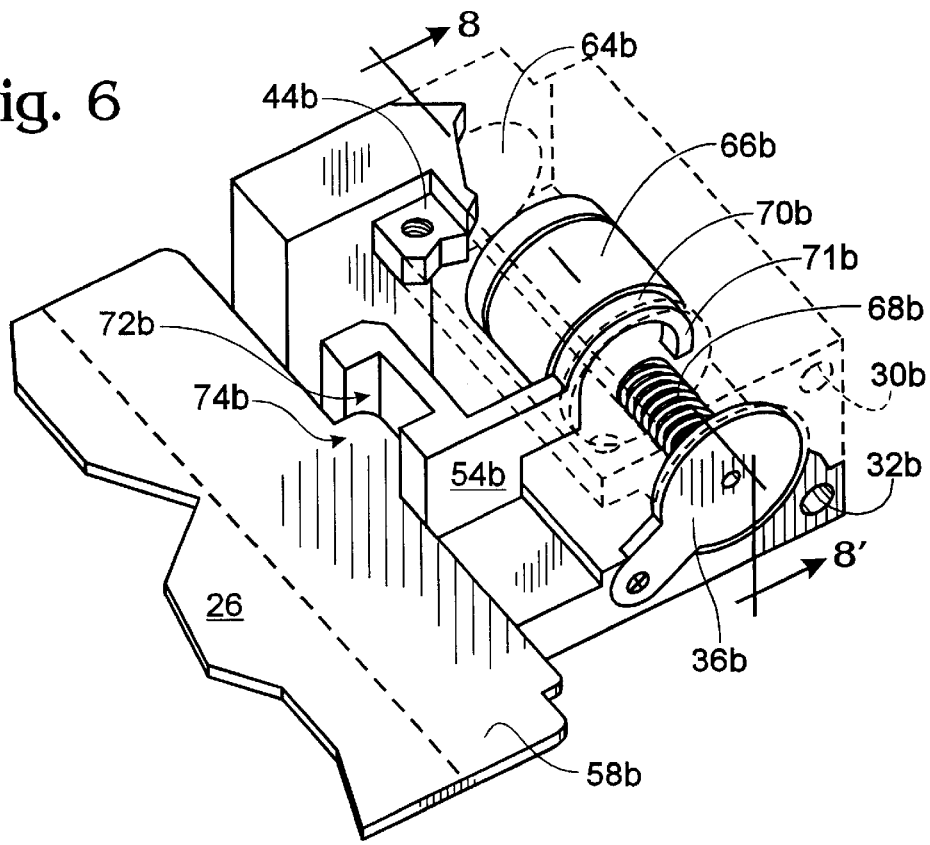
FIG. 6 is another partially transparent and partially cutaway view of the pneumatic driver of FIG. 5, wherein the piston thereof is shown in an outwardly extended disposition.

First and second pneumatic drivers 62a, 62b function in an identical manner, and for purposes of succinctness the operation thereof is shown and described in FIGS. 5, 6 with reference to a single one of them, namely, second pneumatic driver 62b at the rightward end of FIG. 4. In FIGS. 5, 6, which are partially cutaway and partially transparent drawings of the rightward end of FIG. 4, it is shown that second pneumatic driver 62b comprises second pneumatic cylinder 64b into which is first placed a cylindrically shaped and tightly spaced second piston 66b (again, in this discussion and in what follows, a corresponding first piston 66a will be placed within first pneumatic cylinder 64a at the opposite end of MIPCD 10z, and so on). A proximal end of second coil spring 68b is placed into a central indentation of an outwardly facing end of second piston 66b such that second coil spring 68b is coaxial therewith and, as previously noted, second spring retainer 36b is then installed against a distal end of second coil spring 68b by virtue of second protrusion 38b and second mounting screw 40b so as to retain second coil spring 68b within second pneumatic cylinder 64b.

Near to that outwardly facing end of second piston 66b is disposed a fully encircling toroidal groove 70b into which is disposed a half-circle bracket hook 71b that connects to second PCB retainer 54b, thereby making effective connection from second piston 66b to second PCB retainer 54b. In more detail, it is now noted that second PCB retainer 54b includes on the side thereof that faces PCB 26 a second PCB slot 72b into which is disposed second PCB stub 74b, which is contiguous with and extends lengthwise outwardly from PCB 26. By comparison of FIGS. 5 and 6, it can be seen that in FIG. 5, second piston 66b and hence second PCB retainer 54b, second PCB slot 72b, and second PCB stub 74b (and hence PCB 26) are disposed fully inwardly within MIPCD 10, and second coil spring 68b is in an extended disposition. By contrast, in FIG. 6 all of the elements just named have been placed into a more outward disposition, which is accomplished by the application of pneumatic pressure to second pneumatic inlet 34b, second coil spring 68b thereby being placed into a compressed disposition, and the subsequent removal of that pneumatic pressure will through extension of second coil spring 68b cause the structure to resume again the disposition shown in FIG. 5.

FIGS. 7 and 8 are transverse cross-sectional drawings of second pneumatic driver 62b taken respectively along lines 7—7' of FIGS. 5 and 8—8' of FIG. 6, wherein many of the elements of FIGS. 5 and 6 are shown in that different perspective, the relationship of FIGS. 7 and 8 of course being the same as the relationship between FIGS. 5 and 6, i.e., wherein second piston 66b has an inward disposition in FIGS. 5 and 7, and an outward disposition in FIGS. 6 and 8. Also visible in FIGS. 7, 8 is second pneumatic channel 35b, which connects second pneumatic inlet 34b to second cylinder 64b, whereupon application of pneumatic pressure to second pneumatic inlet 34b transmits an air pressure through second pneumatic channel 35b to second piston 66b within second cylinder 64b, thereby causing a change in the disposition of second piston 66b (and of the other components including PCB 26 that are efficaciously interconnected therewith) from that shown in FIGS. 5 and 7 to that shown in FIGS. 6 and 8. Upon termination of such pneumatic pressure, the air so forced into second cylinder 64b is bled back through those lines that transmitted that pneumatic pressure, such that second coil spring 68b is allowed to function as previously described and change the disposition of second piston 66b and associated components from that shown in FIGS. 6 and 8 to that shown in FIGS. 5 and 7.

Figure 9:
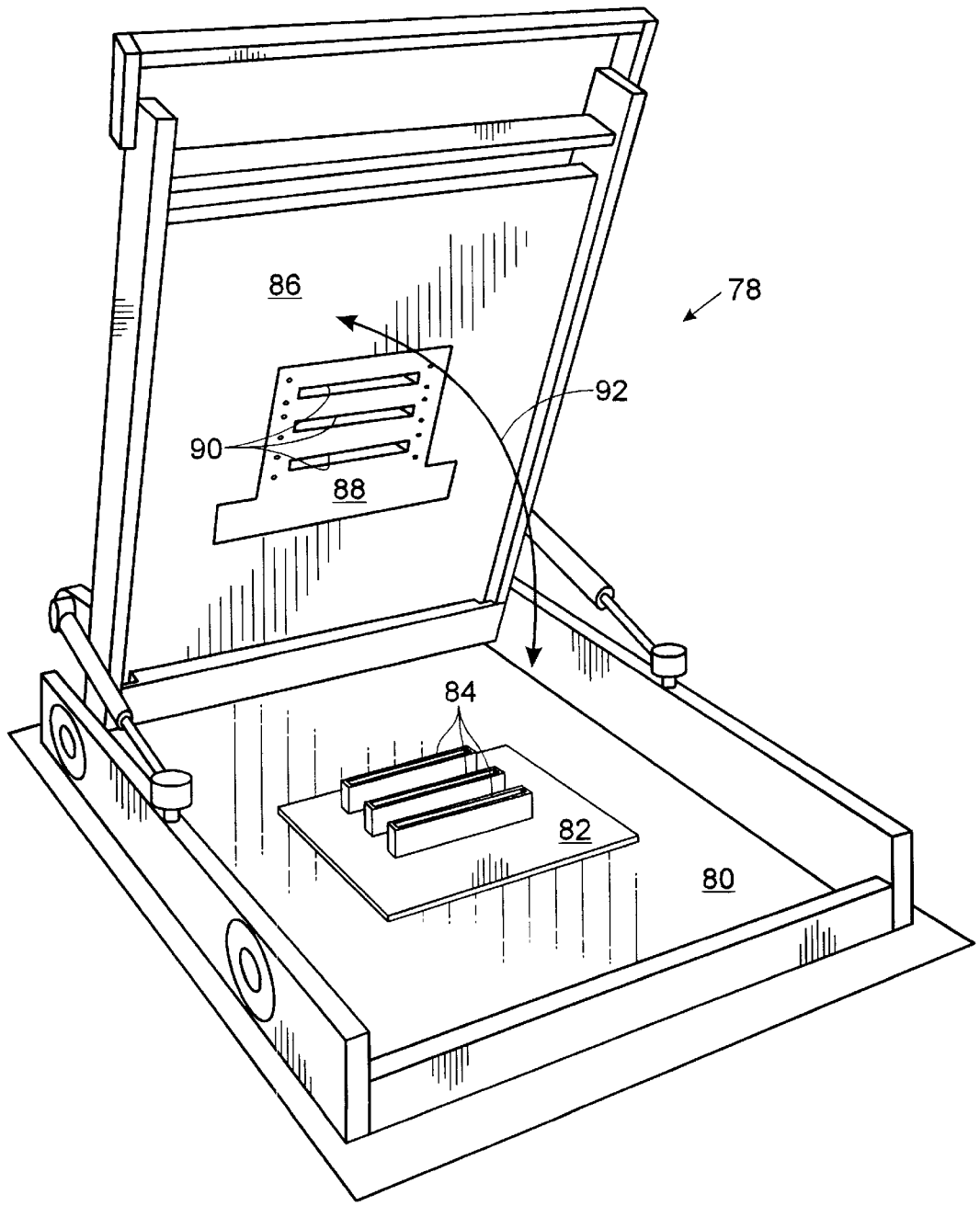
FIG. 9 shows a rack including a lower platen on which is mounted an exemplary frame and test board containing three connectors to which are to be connected corresponding printed circuit boards, together with an open upper platen on the under side of which can be seen three slots corresponding in disposition to the connectors of the lower platen.

FIG. 9 shows a rack 78 including a lower platen 80 on which is mounted an exemplary test board 82 containing three connectors 84 into which are to be connected corresponding printed circuit boards, together with an open upper platen 86 on the under side of which can be seen part of a frame 88 and three slots 90 corresponding in disposition to connectors 84 of test board 82. In operation, after appropriate ones of MIPCD 10 have been installed on the upper surface of upper platen 86 as will hereinafter be described, upper platen 86 is rotated downwardly in the direction of arrow 92 so as to place slots 90 into alignment with connectors 84.

Figure 10:
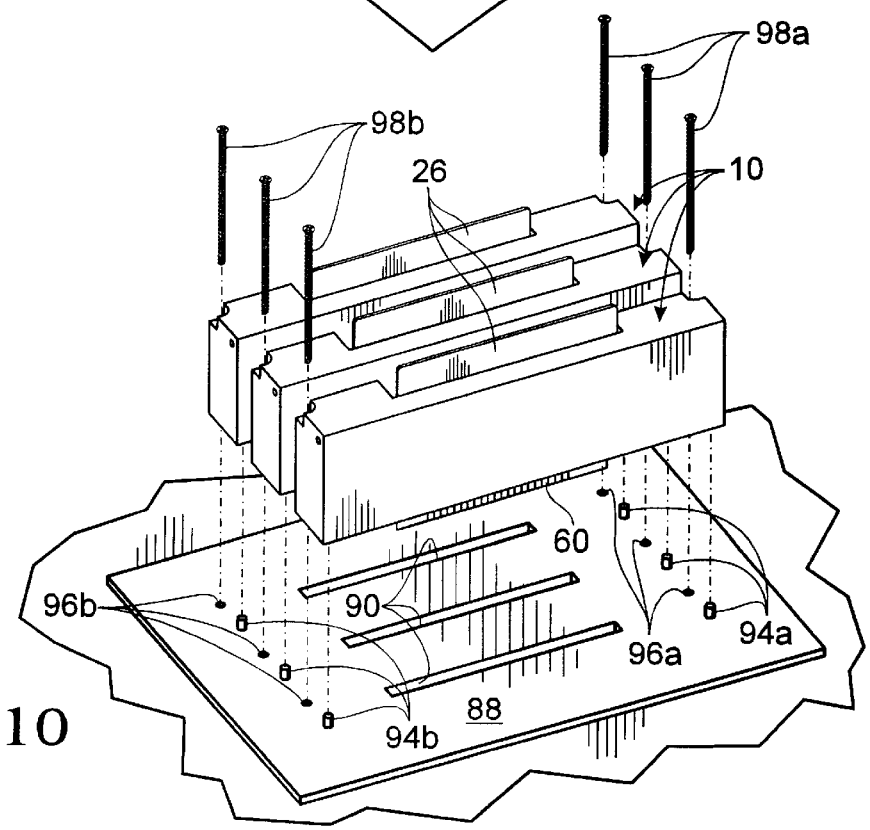
FIG. 10 shows an exemplary upper frame including three slots disposed on the upper side of the upper platen of FIG. 9, together with an exploded view of three instances of the device of FIG. 1 and the manner of attachment thereof to that upper frame.

FIG. 10 shows the manner of installing MIPCD 10 onto upper frame 88 as just indicated. Specifically, the indicated upper surface of upper frame 88 is seen to include for each of the three instances of MIPCD 10 an array of alignment pins 94a, 94b disposed in a manner to be placed into alignment holes 32a, 32b as previously described, and adjacent to each of these are corresponding mounting screw holes 96a, 96b that will have become respectively coaxial with mounting holes 30a, 30b through which are passed mounting screws 98a, 98b into frame 88. In the frontward instance of MIPCD 10 in FIG. 10, edge connectors 60 that lie along the downward edge of PCB 26 are aligned so as to pass through the frontward one of slots 90 and, by virtue of the relationship between frame 88 (and of upper platen 86 to which frame 88 is connected) and test board 82 and its associated connectors 84, upon operation of MIPCD 10 as previously described, edge connectors 60 will pass into connectors 84 upon closure of rack 78 in the direction of arrow 92, and edge connectors 60 may be withdrawn therefrom by upward (back towards MIPCD 10) movement of PCB 26 as was also previously described.

Figure 11:
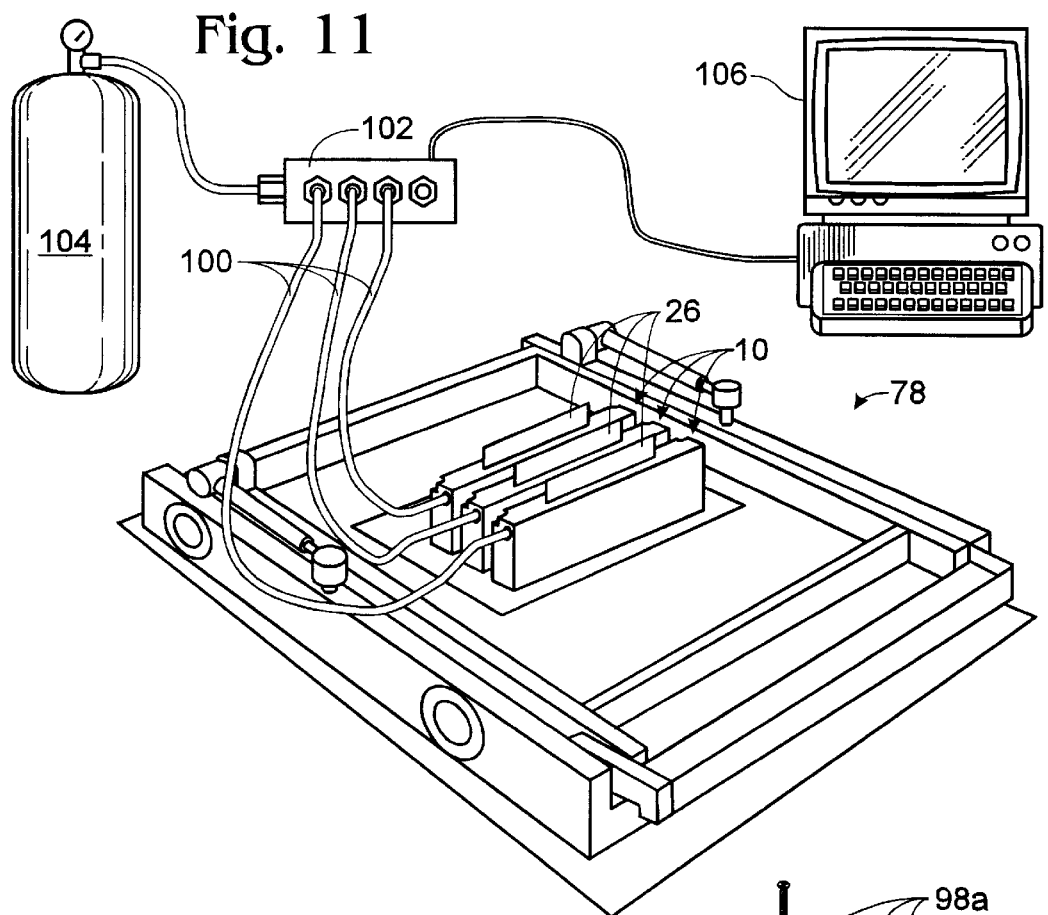
FIG. 11 shows a top perspective view of the upper frame of FIG. 9 having been moved downward over the lower frame of FIG. 9, together with associated pneumatic lines and controls.

FIG. 11 shows a system corresponding to that of FIGS. 9 and 10 wherein rack 78 had been closed, but also showing the manner of providing pneumatic control of the indicated three instances of MIPCD 10, it being understood that the three indicated instance of MIPCD 10 are exemplary only, and that numerous other instances of MIPCD 10, at the same or different angles and of the same or different sizes and shapes so as to accommodate either PCBs of different sizes or other electronic components such as CPUs or test probes or the like might also have been drawn. In addition to rack 78, three instances of MIPCD 10 and the three PCBs 26 contained therein, FIG. 11 also shows proximal ends of a set of pneumatic lines 100 as connected to each instance of MIPCD 10, for purposes of simplicity in the drawing only three leftward instances of pneumatic lines 100 being shown, it being understood from the foregoing discussion that pneumatic lines will ordinarily be connected to both of first and second pneumatic inlets 34a, 34b as to each instance of MIPCD 10. Distal ends of pneumatic lines 100 connect to a pneumatic controller 102, which in air valve means (not shown) to direct pneumatic pressure from air source 104 to selected ones of pneumatic lines 100. Control of pneumatic controller 102 itself is accomplished by computer 106 that is connected thereto, the structure, functioning and control of such air valves by electronic or computer means being a well known art, although to the best of this inventor's knowledge that art has not previously been applied in the manner of the present invention, i.e., as a means of permitting any selected array of electronic components, including PCBs, test probes and the like, to be individually inserted into or onto an underlying circuit board and then withdrawn therefrom as a means of testing either those electronic components themselves or the underlying circuit board.

It will be understood by those of ordinary skill in the art that other arrangements and dispositions of the aforesaid components, the descriptions of which are intended to be illustrative only and not limiting, may be made without departing from the spirit and scope of the invention, which is to be identified and determined only from the following claims and the equivalents thereof.

I claim:

1. An apparatus for removably and individually placing one or more electronic devices having an array of first connectors disposed on a first side thereof, mutually parallel holding strips at opposite ends of a second side thereof that is normal to said first side, and grasping stubs coplanar with said second side and extending outwardly from opposite ends thereof, into electronic connection through said first connectors with corresponding arrays of second connectors that are mounted in dispositions corresponding to those of said first connectors on a circuit board, comprising:

one or more box-like bodies;

a plate-like frame including one or more slots passing therethrough;

attachment means for removably attaching selected ones of said one more bodies to said plate-like frame, at locations that will encompassing within the dimensions of each of said one or more bodies particular ones of said one or more slots;

an aperture extending through each of said one or more bodies;

movable means disposed within each of said apertures for grasping said electronic devices in a disposition such that said first connectors are oriented outwardly, whereby, upon placement of said electronic devices within said movable means and attachment of said one or more bodies to said frame, movement of said movable means as to selected ones of said or more bodies causing said first connectors of said electronic devices contained within those selected ones of said one or more bodies to move into and out of those particular ones of said one or more slots that are encompassed within the dimensions of said one or more bodies by said attachment.

2. The apparatus of claim 1 further comprising a removably attachable cover plate sized essentially to encompass transverse and longitudinal dimensions of said aperture of each of said one or more bodies, whereupon following placement of said electronic devices within one or more of said apertures, attachment of said cover plate causes said electronic devices to be contained within each of said apertures inwardly from said cover plate, and facing towards an inward surface of said cover plate.

3. The apparatus of claim 2 wherein said inward surface of said cover plate further comprises mutually parallel transverse friction walls extending outwardly therefrom near to opposite ends thereof, whereby upon placement of said cover plate onto said body, outwardly facing surfaces of respective ones of said friction walls become placed into slideable contact with corresponding ones of said holding strips.

4. The apparatus of claim 2 wherein said cover plate further comprises an indentation disposed essentially centrally within said inward surface thereof, whereby upon attachment of said cover plate to said body, said indentation lies outwardly from an outward facing surface of said electronic devices, thereby to provide space to accommodate therewithin any additional electronic components that may be mounted on said outward facing surface of said electronic device.

5. The apparatus of claim 1 wherein said movable means comprise bracket means including outwardly facing stub slots disposed at opposite ends thereof, whereby placement of said electronic device within said apparatus is accomplished by placement of said grasping stubs within said stub slots.

6. The apparatus of claim 5 wherein said movable means further comprise pneumatic means comprising:

one or more transverse cylinders;

one or more pistons disposed within corresponding ones of said cylinders and connected to said bracket means;

one or more pneumatic inlets connected to corresponding ones of said cylinders at a first end of each of said pistons;

one or more springs compressibly disposed within corresponding ones of said cylinders at second ends of each of said pistons opposite said first ends;

whereby upon application of pneumatic pressure through selected ones of said one or more pneumatic inlets against corresponding first ends of said pistons will cause longitudinal movement of said pistons through said cylinders in a first movement, and upon removal of said pneumatic pressure said pistons will be caused to move in a second movement opposite to said first movement by action of said springs, thereby causing movement of selected ones of said first connectors of said electronic devices into and out of corresponding ones of said slots.

7. The apparatus of claim 1 further comprising pneumatic control means whereby pneumatic pressure can be applied to or removed from selected ones of said apparatus.

8. A method of inserting and removing first electronic connectors extending outwardly from selected ones of one or more electronic devices into and out of second electronic connectors mounted on a circuit board, comprising:

providing a holding device for each of said one or more electronic devices;

placing one or more of said electronic devices into corresponding holding devices;

attaching a frame having one or more slots passing therethrough to an upper platen;

attaching one or more of said holding devices to said frame;

providing a lower platen containing thereon a circuit board having second electronic connectors disposed thereon in dispositions corresponding to dispositions of said slots;

placing said upper platen into near contiguity with said lower platen, whereby said slots and said first electronic connectors are placed into alignment with said second electronic connectors; and causing movement of said selected ones of said electronic devices relative to said holding devices, whereby corresponding ones of said first electronic connectors are placed into electrical contact with corresponding ones of said second electronic connectors.

* * * * *